United States Patent [19]

Hoult et al.

[11] Patent Number: 4,682,022
[45] Date of Patent: Jul. 21, 1987

[54] DETECTOR PREAMPLIFIER FOR USE WITH A MCT DETECTOR

[75] Inventors: Robert A. Hoult, Bethel; Robert P. Ragusa, New Milford, both of Conn.

[73] Assignee: The Perkin-Elmer Corporation, Norwalk, Conn.

[21] Appl. No.: 704,355

[22] Filed: Feb. 21, 1985

[51] Int. Cl.⁴ .................... H03K 3/01; H03K 3/26; H03K 3/42
[52] U.S. Cl. .................... 250/214 A; 307/297; 307/310; 307/311; 250/238
[58] Field of Search .......... 250/214 A, 214 C, 214 R, 250/214 L, 206, 238; 307/311, 310, 297, 425

[56] References Cited

U.S. PATENT DOCUMENTS

| | | | |
|---|---|---|---|
| 3,723,014 | 3/1973 | Nanba | 250/214 L |
| 3,793,522 | 2/1974 | Coleby et al. | 250/214 C |
| 3,843,880 | 10/1974 | Tsuchiyasu | 250/214 L |
| 3,879,138 | 4/1975 | Kobayashi | 250/206 |
| 3,984,675 | 10/1976 | Corcoran et al. | 307/425 |
| 4,415,803 | 11/1983 | Muoi | 250/214 AG |
| 4,421,985 | 12/1983 | Billingsley et al. | 250/338 |
| 4,567,446 | 1/1986 | Konishi | 250/214 A |

Primary Examiner—Edward P. Westin
Assistant Examiner—Charles Wieland
Attorney, Agent, or Firm—Ronald G. Cummings; Francis L. Masselle; Edwin T. Grimes

[57] ABSTRACT

A preamplifier network or circuit for converting non-linear signal information, such as is produced by a mercury cadmium tellurium (MCT) detector, to a substantially linear voltage signal output corresponding to the incident light levels on the MCT detector. Conceptually speaking, the subject preamplifier functions as a constant-voltage variable-current source to the MCT detector, and incorporates positive feedback for being effective as a negative resistance to nullify the MCT detector resisance introduced signal component of the signal information being monitored.

12 Claims, 3 Drawing Figures

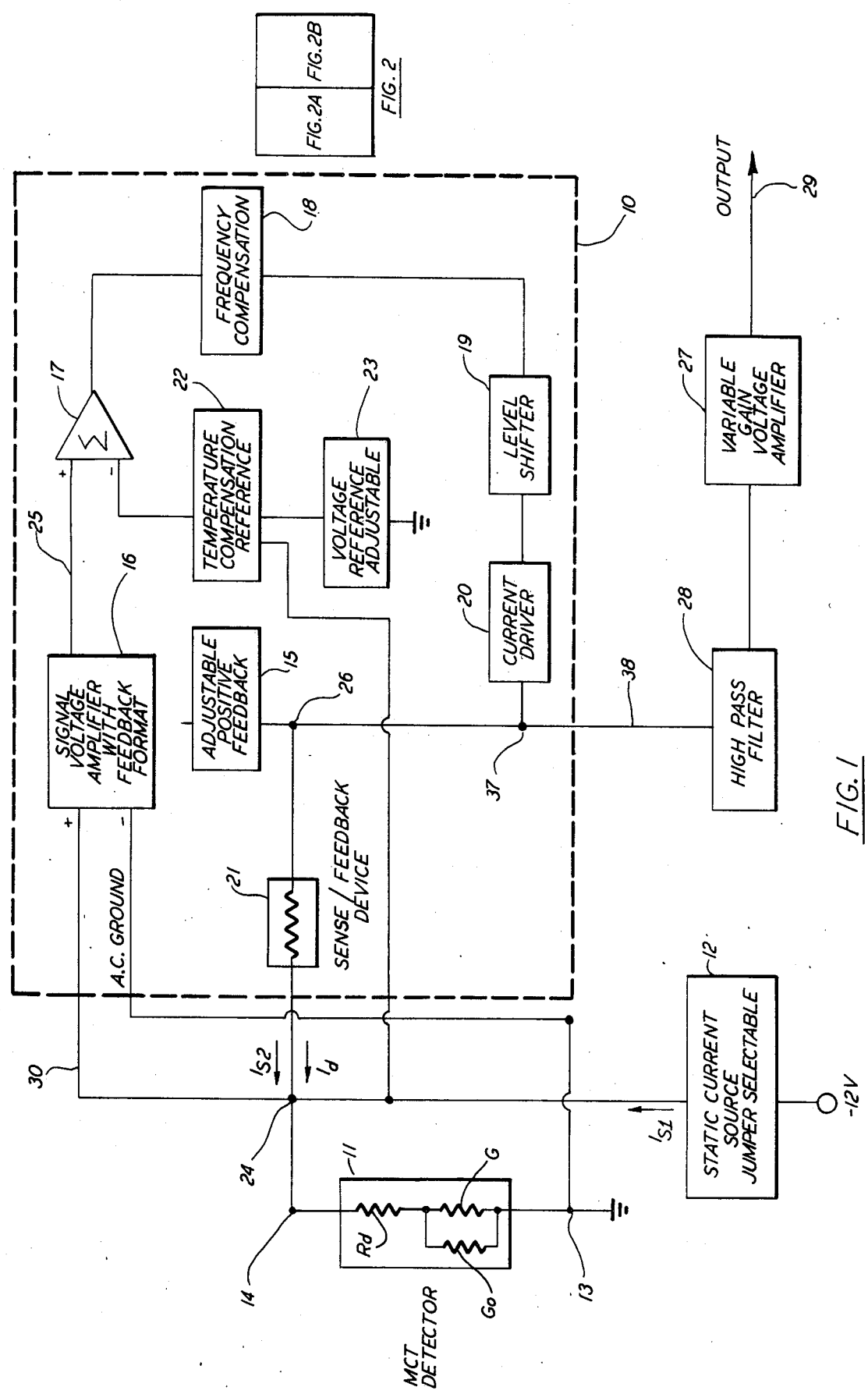

DETECTOR PREAMPLIFIER FOR USE WITH A MCT DETECTOR

FIELD OF THE INVENTION

The present invention relates to amplifier circuits and signal monitoring networks in general and, more particularly, to a preamplifier for a mercury cadmium tellurium/telluride (MCT) or light sensitive type detector.

BACKGROUND OF THE INVENTION

Various types of preamplifier devices have hitherto been proposed for use with MCT detectors.

The conventional MCT detector preamplifiers, however, maintain a fixed current through the MCT detector and measure the voltage generated across the MCT detector. In effect, therefore, the resistance change caused by the illumination or incident light typically is monitored, rather than the change of conductance through the MCT detector. This technique generally has resulted in inherently non-linear output measurements.

Accordingly, a serious disadvantage is presented by the above discussed prior art preamplifiers in order to meet their operational criteria of maintaining a fixed current through the light detector while measuring the voltage generated across it.

The present invention involves a novel approach and circuit features combined in such a way as to afford a substantial solution to the difficulties, problems and generally not precise measurements encountered/tolerated in the prior art.

For example, in total contrast to the prior art, the present invention provides a preamplifier circuit arrangement or network for maintaining a generally fixed voltage across the MCT detector while measuring or detecting a current through the varying incident light.

SUMMARY OF THE INVENTION

Generally speaking, and in accordance with the invention, a preamplifier having particular utility for an MCT detector is provided, comprising:

means (12) for providing a selectable dark or static current ($I_{s1}$), and a dynamic current ($I_d$) that varies generally in proportion to the changes of incident light on the MCT detector for providing a variably current determined or based output signal being indicative of the incident light changes;

positive feedback means (15) for providing a voltage/current signal to substantially nullify or cancel the resistance effects introduced by the stray resistance ($R_d$) of the MCT detector on said output signal.

Accordingly, it is an object of the present invention to provide a novel preamplifier.

It is a further object of the present invention to provide a new and improved preamplifier for mercury cadmium telluride detectors.

It is a further object of the present invention to provide a preamplifier that substantially maintains a constant or fixed voltage across an MCT detector.

It is a further object of the present invention to provide a preamplifier that varies the current through an MCT detector substantially in proportion with the incident light on the MCT detector.

It is a further object of the present invention to provide a preamplifier that generally maintains a fixed voltage across while varying the current through an MCT detector with incident light changes.

It is a further object of the present invention to provide a preamplifier which utilizes positive feedback to offset or nullify unwanted signal component information.

It is a further object of the present invention to provide a preamplifier having improved linearity.

It is a further object of the present invention to provide a preamplifier for a light detector whose output voltage is linearly related to the incident light levels, exhibits relatively low noise.

It is a further object of the present invention to provide a preamplifier that substantially detects changes in the conductance through a detector with changes of incident light thereon.

BRIEF DESCRIPTION OF THE DRAWINGS

Other objects and advantages of the present invention will be evident from the following detailed description when read in conjunction with the accompanying drawings which illustrate the preferred embodiment of the present invention. Similar reference numerals refer to similar parts throughout.

FIG. 1 is a block diagram of the preferred embodiment of the preamplifier in accordance with the invention.

DESCRIPTION OF THE PREFERRED EMBODIMENT

Figure 2A:
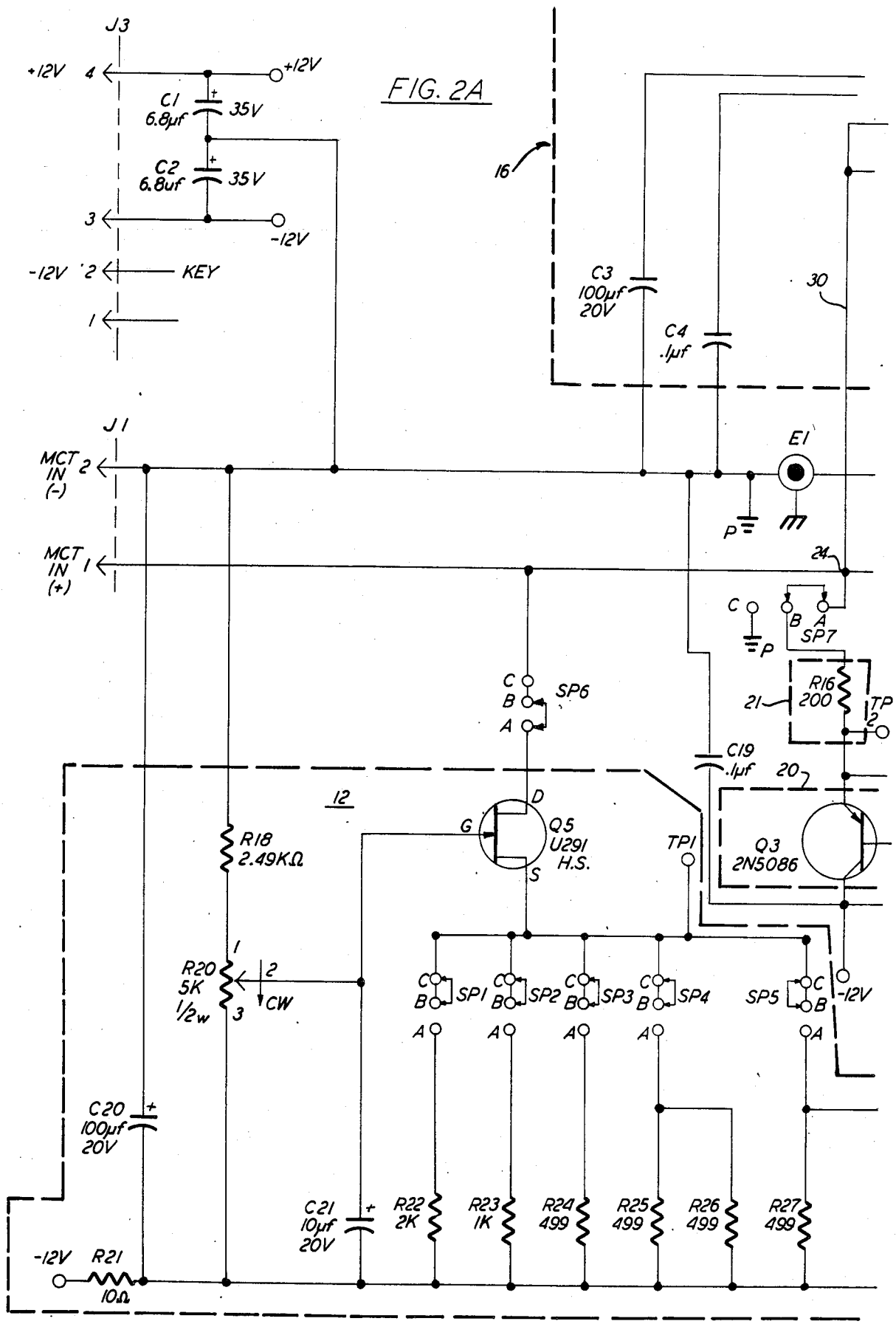
FIG. 2A and 2B are a circuit diagram of the preamplifier illustrated in FIG. 1.

With reference now to FIG. 1, there is shown a block diagram of the preferred embodiment of preamplifier 10, in accordance with the invention, connected across a mercury cadmium telluride (MCT) or light sensitive detector 11. The design of preamplifier 10 is generally based upon the conjectured or discovered equivalent circuit model for detector 11 as shown within block 11.

Applicants discovered that the operating characteristics of an (MCT) detector 11 could be substantially represented by an equivalent circuit model comprising: a fixed conductance $G_o$ which carries the detector dark or static current; a second conductance G in parallel with conductance $G_o$ and whose conductance varies proportionally with the illumination or incident light; and a stray fixed series resistance $R_d$. With this understanding of the characteristics of the (MCT) detector 11, it was recognized that since the prior art preamplifiers typically maintain a fixed current through the (MCT) detector while measuring the voltage generated across it, and inherently non-linear output generally does result.

Accordingly, the basic concept of the invention is to effect a preamplifier, for example preamplifier 10, whereby a dynamic current $I_d$ is caused to vary through detector 11 in proportion to the changing illumination, while introducing a signal component for substantially nullifying the signal contaminating effects of the stray resistance $R_d$ on the signal information being monitored.

For ease of understanding, it will first be assumed that a dark condition exists, i.e., a state of little or no illumination on detector 11. With detector 11 in the dark condition, static current source 12 is set or adjusted to provide a static current $I_{s1}$ to detector 11.

The static current source 12 may be of conventional design, for example, having jumper selectable means (not shown) for selecting a static current $I_{s1}$ within the recommended range for the particular detector 11 being used.

Preamplifier 10 is adjusted or preconditioned, as will be discussed more fully hereinafter, to provide a second static current $I_{s2}$, which comprises a bias current for the preamplifier 10.

The static currents $I_{s1}$ and $I_{s2}$ establish a voltage across detector 11. It is this voltage value which is maintained substantially constant under the operation of preamplifier 10 as will be explained in detail below.

It should be recognized that with a dark condition existing, detector 11 displays a (static) resistance value across terminals 13 and 14. However, as light is detected by detector 11, its conductance increases, i.e., the effective resistance across terminals 13 and 14 decreases, which has an instantaneous voltage reducing tendency.

As noted above, preamplifier 10, in accordance with the invention, uses the novel approach of holding the voltage across detector 11 substantially constant while detecting or monitoring the current required to do this.

The voltage across detector 11 is held substantially constant by the operation of a servo-loop network 16–21. The servo-loop network 16–21 comprises a signal level detector or signal voltage amplifier with feedback input 16, a summing (operational) amplifier 17, a frequency compensation circuit 18, a level shifter 19, a current driver 20 and a feedback (resistor) element 21.

In operation, with an (instantaneous) voltage drop being sensed or detected at junction 24 by signal level detector 16, a signal (not shown) is provided via lead 25 to summing amplifier 17. The output signal (not shown) of summing amplifier 17 is coupled via frequency compensation network or circuit 18 to the input of level shifter 19. Level shifter 19 in response to this signal, causes current driver 20 to provide, via feedback device 21, a dynamic current $I_d$ level to maintain the voltage across detector 11 substantially fixed or constant. In this manner, the dynamic current $I_d$ through feedback device 21 and detector 11 is supplied in proportion to the conductance change across detector 11.

In being understood that as the illumination on detector 11 is then decreased, the above described servo-loop network 16–21 effects a reduction in the dynamic current $I_d$ being provided, via feedback device 21, to detector 11, again in proportion to maintain the substantially predetermined dark voltage level across detector 11. Unfortunately, the stray resistance $R_d$ introduces a significant unwanted voltage drop, which if uncompensated for would prevent the measured output from being linear.

The effect of the stray resistance is substantially canceled by introducing an equal but negative resistance into the preamplifier circuit network 10. This negative resistance is simulated by causing the voltage across detector 11 to rise in direct proportion to the change in current $I_d$ by a factor equal to $R_d$. A positive feedback network 15 is used to generate the effective or simulated negative resistance effect. Since the value of the stray resistance $R_d$ cannot be measured directly, the positive feedback is adjusted, for example, by a potentiometer, empirically to give the best linearity as judged by the apparent energy level of the wavenumbers below the detector 11 cutoff, which should be essentially or approximately zero.

A temperature compensation network, for example, comprising a temperature compensation reference 22 and an adjustable voltage reference 23, may be provided to effect correction to the servo-loop network operation, in particular signal voltage amplifier 16, with variation in temperature conditions.

The dynamic current $I_d$ is sensed at junction 26 by variable gain voltage amplifier 27, via high pass filter 28. Variable gain voltage amplifier 27, in turn, provides a signal output at terminal 29 which is substantially a linear representation of the conductance through detector 11 and, therefore, the incident light levels.

Since the circuit details and components comprising detector 11, static current source unit 12, high pass filter 28 and variable gain voltage amplifier 27 may be of conventional design, no further explanation will be made herein to avoid prolixity.

Figure 2B:
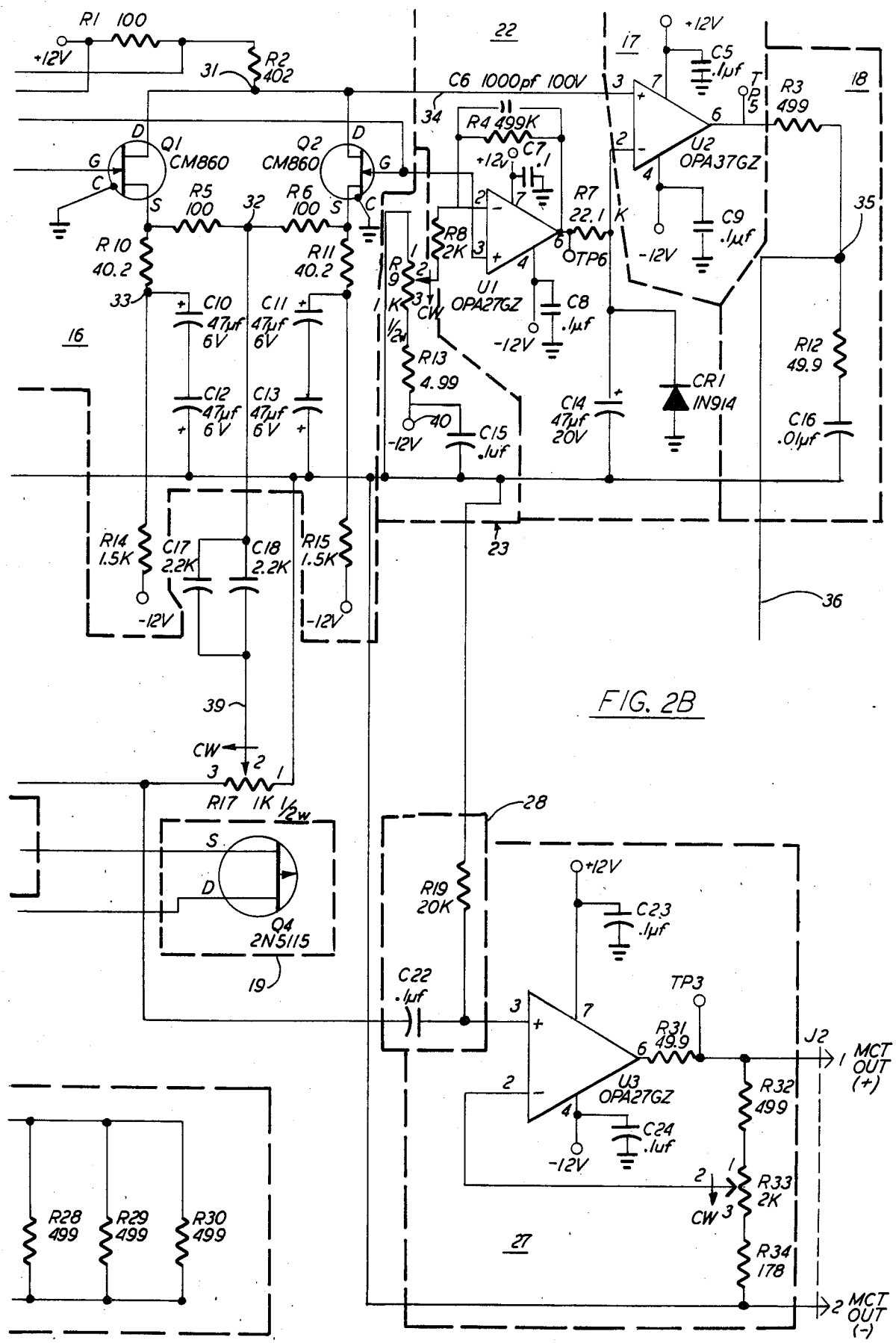

With particular reference to FIG. 2, the circuit details of preamplifier 10 will now be discussed.

The servo-loop network 16–21 components and circuit functions will be discussed first. As noted above, junction point 24 is connected to detector 11, static current source unit 12, one end of sense/feedback device 21 and, via lead 30, to the signal voltage amplifier-A.C. gain control unit or signal level detector 16.

Signal Voltage Amplifier and A.C. Gain Control

Lead 30 connects the gates G of field effect transistors (FET) Q1 and Q2 and the non-inverting (+) input terminal of operational amplifier U1.

Field effect transistors Q1 and Q2 are N-channel type transistors connected in parallel common source mode operation, with their cases connected to ground for low noise operation. The drain of field effect transistors Q1 and Q2 are connected to junction point 31 and the non-inverting input (+) of operational amplifier U2. The source S of field effect transistor Q1 is connected between the common junction of resistors R5 and R10. The source S of field effect transistor Q2 is connected between the common junction of resistors R6 and R11. In operation field effect transistors Q1 and Q2 provide voltage amplification of the gate G to source S voltage by sinking or sourcing current through resistor R2.

Resistors R5 and R6 have their common junction 32 connected to the adjustable positive feedback circuit 15. Resistors R5 and R6 are current sharing resistors which force the positive feedback current to be shared between field effect transistors Q1 and Q2 and their source resistors R10 and R11, respectively.

Capacitors C10 and C12 are polarized capacitors connected in back-to-back function between the common junction 33 of resistors R10 and R14, and ground potential so as to effect an A.C. ground at junction 33.

Resistor R14 is connected between junction 33 and a −12 volt supply for setting the bias current through the source S to drain D of field effect transistor Q1.

In like manner, the source S of field effect transistor Q2 is biased by means of resistors R11, R15 and capacitors C11, C13, which function in similar manner as resistors R10, R14 and capacitors C10, C12, respectively.

Resistor R2 is connected at one end to junction 31 and at its other end to resistor R1. Resistor R2 basically functions as a drain or load resistor for generating a proportional voltage to the A.C. current through field effect transistors Q1 and Q2. This voltage is coupled, via lead 34 to the non-inverting (+) input of summing amplifier U2.

Resistor R1 and Capacitor C3 basically function as a low pass filter, to filter A.C. noise out of the positive supply.

Capacitor C4 functions both as a by-pass A.C. filter and a load regulator means.

Summing Amplifier

The summing amplifier 17 (see FIG. 1) basically comprises an operational amplifier U2 having its non-inverting (+) input connected, via lead 34, to junction 31. Its inverting (−) input is connected to a reference source, for example, temperature compensation reference 22 as will be described more fully hereinafter.

Capacitors C5 and C9 basically function as by-pass elements to filter unwanted A.C. noise to ground.

Frequency Compensation

The frequency compensation network or unit 18 is basically a pole-zero compensation circuit comprising resistors R3 and R12, and capacitor C16. The component values are selected such that the pole is approximately at 30K Hertz, and the zero is approximately at 300K Hertz. The frequency compensation network 18 is used to keep the servo-loop network 16-21 stable. The output of summing amplifier U2 is connected to the input, i.e., one end of resistor R3, of frequency compensation network 18 and its output is connected, via junction 35 and lead 36, to the input of level shifter 4.

Level Shifter

The level shifter 19 comprises a field effect transistor Q4 having its gate connected, via lead 36, to junction 35 of frequency compensator 18, a drain D connected to the −12 volt supply, and a source S connected to the current driver 20. The level shifter 19 basically functions to increase the voltage range of the summing amplifier U2.

Current Driver

The current driver 20 comprises an emitter follower type transistor configuration having its collector connected to the −12 volt supply, and emitter connected to the common junction 26 between sense/feedback resistor R16 and potentiometer R17, and a base connected to the source of field effect transistor 17. Current driver 20 basically functions as a current booster to enhance the output signal of summing amplifier U2.

Sense/Feedback Device

The sense/feedback device 21 comprises a resistor R16 connected in series between junctions 24 and 37. The basic functions of feedback resistor R16 are to couple the static current $I_{s2}$ and dynamic current $I_d$, via junction 24, to detector 11, establish a voltage signal at junction 24 to be coupled to the gates G of field effect transistors Q1 and Q2 via lead 30, and establish an output signal at junction 37 coupled, via lead 38, to high pass filter 28.

Adjustable Positive Feedback

As noted above, positive feedback is used to provide a negative resistance effect by injecting (A.C. coupled) feedback current into the common gate mode coupled field effect transistors Q1 and Q2. Basically, the positive feedback unit 15 comprises a trim-pot or potentiometer R17 connected between ground and junction 26, with its wiper 39 connected, via capacitors C17 and C18, to junction 32. Capacitors C17 and C18 filter out or block D.C. from the feedback path to field effect transistors Q1 and Q2. Trim-pot R17 setting varies from detector to detector and is also somewhat dependent upon the light level at which it is set-up for. Accordingly, trim-pot R17 may be adjusted empirically for best linear results under the particular operating circumstances.

Adjustable Voltage Reference

The adjustable voltage reference unit or circuit 23 comprises trim-pot or potentiometer R9, resistor R13, and capacitor C15. Trim-pot R9 and resistor R13 are connected in series between ground and the −12 volt supply terminal 40. Capacitor C15 is connected between terminal 40 and ground, and functions as a by-pass capacitor to decouple terminal 40 from A.C. noise. Trim-pot R9 in conjunction with resistor R13 sets the voltage bias coupled, via resistor R8, to the inverting (−) input of operational amplifier U1. Resistor R13 is a range resistor to place trim-pot R9 in the proper or desired operating voltage range. When resistor R13 is set, the extra dynamic bias current $I_d$ being supplied to a darkened detector is generally in the range of a few milliamps.

Temperature Compensation Reference

The temperature compensation reference circuit 22 comprises operational amplifier U1, resistors R6, R7 and R8, capacitors C6, C7, C8 and C14, and diode CR1. Resistors R4 and R8 set the gain of operational amplifier U1. The main function of capacitor C6 is to stabilize operational amplifier U1, however, in conjunction with resistor R4 it also functions as a low pass filter to couple low frequency from the inverting (−) input to the output of operational amplifier U1 and blocks high frequency, for example, above 300 Hertz. Capacitors C7 and C8 are decoupling or by-pass capacitors to keep the +12 volt and −12 volt supply clean of A.C. noise. Resistor R7 and capacitor C14 are connected in series between the output of operating amplifier U1 and ground, and function as a low pass filter to cutoff at about 1 Hertz. Diode CR1 is connected between ground (P) and the common junction of resistor R7 and capacitor C14. Diode CR1 functions to keep operational amplifier U1 from depolarizing capacitor C14. The reference voltage output of voltage reference circuit 23 is coupled via resistor R8 to the inverting (−) input of and served by operational amplifier U1, which compares the detector voltage on junction 24, via lead 30 and the non-inverting (+) input of operational amplifier U1, directly with the preset reference voltage at frequencies generally below 1 Hertz. Thus, the effect of any slow temperature drift in the field effect transistors Q1 and Q2 are substantially canceled or nullified.

The preamplifier 10 shown in FIG. 2 provided satisfactory results with the components (which can be selected empirically or by calculation) listed in Table 1.

TABLE 1

| |
|---|
| C3 = 100 microfarads |
| C4 = C5 = C7 = C8 = C9 = C15 = C19 = 0.1 microfarads |
| C10 = C11 = C12 = C13 = C14 = 47 microfarads |
| C17 = C18 = 2.2 microfarads |
| C6 = 1000 picofarads |
| C16 = 0.01 microfarads |
| R1 = R5 = R6 = 100 ohms |
| R2 = 402 ohm |
| R3 = 499 ohms |
| R4 = 499 K-ohms |
| R7 = 22.1 K-ohms |
| R8 = 2 K-ohms |
| R9 = R17 = 1 K-ohms |
| R10 = R11 = 40.2 ohms |
| R12 = 49.9 ohms |

TABLE 1-continued

|  |  |
|---|---|
|  | R13 = 4.99 K-ohms |
|  | R14 = R15 = 1.5 K-ohms |
|  | R16 = 200 ohms |
| Field effect transistors Q1,Q2 | CM860 (Teledyne Crystalonics) |
| Field effect transistor Q4 | 2N5115 |
| Transistor Q3 | 2N5086 |
| Operational amplifier U1 | OPA27GZ (Burr-Brown) |
| Operational amplifier U2 | OPA37GZ (Burr-Brown) |

It is to be understood that the above described embodiment is illustrative of the application of the principles of the present invention. Other arrangements may be devised by those skilled in the art without departing from the spirit and scope of the claimed invention.

What is claimed is:

1. A preamplifier having particular utility for a detector that exhibits a fixed electrical resistance effect and a conductance effect which changes with incident light intensity, comprising:
    means for providing to the detector a substantially fixed voltage potential and a current that varies with a change in the detector conductance;
    means responsive to said current for providing an output signal being indicative of the incident light intensity on the detector; and
    positive feedback circuit means for substantially offsetting any nonlinearity caused by the fixed electrical resistance effect of the detector to thereby linearize said output signal, said positive feedback circuit means being connected to said providing means and comprising means for providing a negative resistance effect to substantially nullify the electrical resistance effect of the detector.

2. A preamplifier as in claim 1, wherein:
    the means for providing a substantially fixed voltage potential and a variable current comprises a servo-loop network.

3. A preamplifier as in claim 1, including:
    a temperature compensation circuit means for compensating for temperature drift in said servo-loop network, said compensation circuit means being connected to said servo-loop network.

4. A preamplifier having particular utility for a detector that exhibits a fixed electrical resistance effect and a conductance effect which changes with incident light intensity, comprising:
    means for providing to the detector a substantially fixed voltage potential and a current that varies with a change in the detector conductance; and
    means responsive to said current for providing a signal being indicative of the incident light intensity on the detector,
    said means for providing a substantially fixed voltage and a variable current comprising a signal level detector circuit having a signal input adapted for connection to the detector and an output, a summing amplifier circuit having a first input coupled to the output of said signal level detector and having a second input connected to a reference voltage and having an output, a frequency compensation circuit operatively coupled to the output of said summing amplifier circuit and having an output, a level shifter circuit having an input operatively coupled to the output of said frequency compensation circuit and having an output, a current drive circuit operatively connected to the output of said level shifter circuit and having an output operatively connected to the detector.

5. A preamplifier as in claim 4, including:
    a positive feedback circuit operatively coupled between said signal level detector and the detector; and
    a temperature compensation circuit for providing said reference voltage to said summing amplifier circuit.

6. A preamplifier having particular utility for a detector that displays a generally fixed spurious resistance effect and displays an electrical conductance effect which varies proportionally with incident luminance variation, comprising:
    means for providing a substantially fixed dark current to the detector;
    means for providing a dynamic current to the detector, said dynamic current being varied in direct proportion to a change in the detector conductance to maintain a substantially constant voltage potential across the detector;
    means for providing a current to the detector to substantially offset any non-linearity being effected by the detector spurious resistance on said dynamic current; and
    means being responsive to said dynamic current for providing an output signal indicative of the incident luminance.

7. A preamplifier as in claim 6, wherein:
    the means for providing said dark current includes a jumper selectable current source.

8. A preamplifier as in claim 6, wherein:
    the means for providing a dynamic current includes a servo-loop network having a positive feedback circuit.

9. A preamplifier as in claim 8, wherein:
    the means for providing a current to the detector comprises a current drive means intercoupled with and responsive to said servo-loop network.

10. A circuit having particular utility for use with a mercury cadmium telluride detector, comprising:
    signal sensing and feedback means (21) adapted for connection to the detector;
    a signal level detector circuit (16) being operatively coupled to said signal sensing and feedback means and having a first output;
    a summing amplifier circuit (17) being operatively coupled to said first output and to a reference potential circuit (22, 23), and having a second output;
    a pole-zero compensation circuit (18) being operatively coupled to said second output, and having a third output;
    a level shifter circuit (19) operatively coupled to said third output, and having a fourth output;
    a current driver circuit (20) operatively coupled to said fourth output, and having a fifth output operatively coupled to said signal sensing and feedback means; and
    an adjustable positive feedback circuit (15) operatively coupled between said signal sensing and feedback means and said signal level detector.

11. A circuit as in claim 10, wherein:
    the signal sensing and feedback means comprises a resistor;
    the signal level detector circuit comprises a pair of field effect transistors operatively connected in parallel common source mode operation;

the summing amplifier comprises an operational amplifier having a first input coupled to said first output and having a second input coupled to said reference potential circuit;

the pole-zero compensation circuit comprises a resistor-capacitor circuit;

the level shifter circuit comprises a field effect transistor;

the current driver circuit comprises a transistor; and the adjustable positive feedback circuit comprises a trimpot having its wiper coupled via a capacitor to said signal level detector circuit.

12. A circuit as in claim 10, including:

a jumper selectable static current source circuit (12) operatively coupled between a voltage-current source and the detector;

a high pass filter circuit (28) having its input operatively coupled to said signal sensing and feedback means; and a variable gain voltage amplifier circuit (27) operatively coupled to the output of said high pass filter circuit.

* * * * *